(12) United States Patent
Tabrizian

(10) Patent No.: US 11,611,328 B2
(45) Date of Patent: Mar. 21, 2023

(54) FIN BULK ACOUSTIC RESONATOR TECHNOLOGY FOR UHF AND SHF SIGNAL PROCESSING

(71) Applicant: University of Florida Research Foundation, Incorporated, Gainesville, FL (US)

(72) Inventor: Roozbeh Tabrizian, Gainesville, FL (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 524 days.

(21) Appl. No.: 16/637,496

(22) PCT Filed: Aug. 17, 2018

(86) PCT No.: PCT/US2018/000295
§ 371 (c)(1),
(2) Date: Feb. 7, 2020

(87) PCT Pub. No.: WO2019/036010
PCT Pub. Date: Feb. 21, 2019

(65) Prior Publication Data
US 2020/0259479 A1    Aug. 13, 2020

Related U.S. Application Data

(60) Provisional application No. 62/546,667, filed on Aug. 17, 2017.

(51) Int. Cl.
*H03H 9/17* (2006.01)
*H01L 27/20* (2006.01)
(Continued)

(52) U.S. Cl.
CPC ............ *H03H 9/177* (2013.01); *H01L 27/20* (2013.01); *H03H 3/02* (2013.01); *H03H 9/1007* (2013.01);
(Continued)

(58) Field of Classification Search
CPC ........ H03H 9/177; H03H 9/2405; H03H 9/13; H03H 3/072; H03H 3/02; H03H 2003/027; H03H 2009/155; H03H 2009/241
See application file for complete search history.

(56) References Cited

U.S. PATENT DOCUMENTS 8,519,598 B1    8/2013  Ayazi et al.
9,318,998 B1    4/2016  Tabrizian et al.
(Continued)

OTHER PUBLICATIONS

International Searching Authority, International Search Report and Written Opinion for International Application No. PCT/US2018/000295, dated Dec. 4, 2018, (15 pages), U.S. Patent and Trademark Office.

*Primary Examiner* — Jeffrey M Shin
(74) *Attorney, Agent, or Firm* — Alston & Bird LLP

(57) ABSTRACT

A Fin Bulk Acoustic Resonator (FinBAR) includes a fin integrally fabricated on a substrate of a glass or a semiconductor, an inner electrode deposited on the fin, a piezoelectric layer disposed on the inner electrode, an outer electrode deposited on the piezoelectric layer, a first electrode and a second electrode formed on the top surface of the substrate and connected to the inner and outer electrodes respectfully. The fin is characterized with a larger height than its width. A FinBAR array including a number of the FinBARs with different fin widths sequentially located on one chip is capable of continuously filtering frequencies in UHF and SHF bands.

19 Claims, 8 Drawing Sheets

(51) Int. Cl.
   *H03H 3/02* (2006.01)
   *H03H 9/10* (2006.01)
   *H03H 9/13* (2006.01)
   *H03H 9/15* (2006.01)

(52) U.S. Cl.
   CPC ......... *H03H 9/13* (2013.01); *H03H 2003/027* (2013.01); *H03H 2009/155* (2013.01)

(56) References Cited

U.S. PATENT DOCUMENTS

| | | |
|---|---|---|
| 2006/0044081 A1 | 3/2006 | Tanaka et al. |
| 2006/0273416 A1 | 12/2006 | Ayazi et al. |
| 2008/0224717 A1 | 9/2008 | Kim et al. |
| 2010/0207495 A1 | 8/2010 | Kikushima et al. |
| 2012/0329255 A1 | 12/2012 | Quevy et al. |
| 2014/0327339 A1* | 11/2014 | Katsumura ............ H02N 2/188 310/321 |

* cited by examiner

FIN BULK ACOUSTIC RESONATOR TECHNOLOGY FOR UHF AND SHF SIGNAL PROCESSING

CROSS-REFERENCE TO RELATED APPLICATIONS

This application is a national phase entry of International Application No. PCT/US2018/000295 filed on Aug. 17, 2018, which claims priority to U.S. Provisional Patent Application No. 62/546,667 filed on Aug. 17, 2017, the contents of which are incorporated herein by reference in its entirety.

TECHNICAL FIELD

The present application relates to acoustic devices, and in particular, to a Bulk Acoustic Resonator (BAR) device.

BACKGROUND

A thin-film bulk acoustic resonator (FBAR or TFBAR) is a device consisting of a piezoelectric material sandwiched between two electrodes and acoustically isolated from the surrounding medium. FBAR devices using piezoelectric films with thicknesses ranging from several micrometers down to tenth of micrometers resonate in the frequency range of roughly 100 MHz to 10 GHz. Aluminum nitride (AlN) and zinc oxide (ZO) are two common piezoelectric materials used in FBARs. A common application of FBARs is radio frequency (RF) filters for use in cell phones and other wireless applications. Such filters are made from a network of resonators (either in half-ladder, full-ladder, lattice or stacked topologies) and are designed to remove unwanted frequencies from being transmitted in such devices, while are allow other specific frequencies to be received and transmitted. They have partially replaced an earlier technology based on surface acoustic wave (SAW) devices, from their smaller size and increased fabrication and operating efficiency. For example, an array of BAR filters that are electrically connected to each other are used in wireless data communication for applications in Internet of Things (IoT) and Internet of Vehicles (IoV), including sensor applications. For instance, when a FBAR device is put under mechanical pressure, its resonance frequency will shift.

Although BAR filters are generally used for both Ultra-High-Frequency (UHF: 0.3 GHz to 3 GHz) and Super-High-Frequency (SHF: 3 GHz to 30 GHz), a single BAR filter can only operate at a specific single frequency, therefore, it cannot be used for a multi-frequency wireless system that requires several RF filters working simultaneously at different frequencies in UHF and SHF bands. That is, each BAR filter can only dedicate to a UHF signal processing application or a SHF signal processing application. It has been difficult for current BAR filters to provide required continuous frequency tuning capability in the same manufactured resonator batch.

Thus, there is a need to create integrated BAR filter arrays capable of working in multiple frequencies and multiple bands.

SUMMARY

Embodiments of the disclosure provide novel and advantageous Fin Bulk Acoustic Resonator (FinBAR) device and FinBar array devices that show high quality factor, high electromechanical coupling coefficient, and capable of continuously filtering in the range of UHF and SHF bands.

In an embodiment, a FinBAR includes a substrate, a fin formed on the substrate, an inner electrode disposed on the fin, a piezoelectric layer disposed on the inner electrode, and an outer electrode disposed on the piezoelectric layer, wherein the fin is characterized with a height larger than a width.

In another embodiment, a FinBAR comprises a substrate, a fin formed on the substrate, wherein the fin is characterized with a width and a height; an inner electrode disposed on the fin, a piezoelectric layer disposed on the inner electrode, an outer electrode disposed on the piezoelectric layer, a first electrode formed on a top surface of the substrate and connected to the inner electrode, a second electrode formed on the top surface of the substrate and connected to the outer electrode, a first through-substrate-via passing through the substrate and connected to the first electrode, and a second through-substrate-via passing through the substrate and connected to the second electrode.

In another embodiment, a FinBAR array includes a plurality of FinBARs, as disclosed in the embodiment in the last paragraph, wherein at least two of the FinBARs have different fin widths from each other.

In another embodiment, an encapsulating layer is deposited over the fin and electrodes to form a protective housing.

In yet another embodiment, a method for manufacturing a FinBAR comprises providing a substrate, depositing a hard mask on the substrate; patterning the hard mask to form a fin, a first portion and a second portion both connecting to the fin, and a trench surrounding the fin, the first and the second portions; removing the hard mask; forming a shadow mask around the fin and into the trench such that the fin is exposed through the shadow mask; forming an inner electrode on the fin; forming a piezoelectric layer on the inner electrode; and forming an outer electrode on the piezoelectric layer; wherein a height of the fin is larger than the width of the fin.

DETAILED DESCRIPTION

Figure 1A:
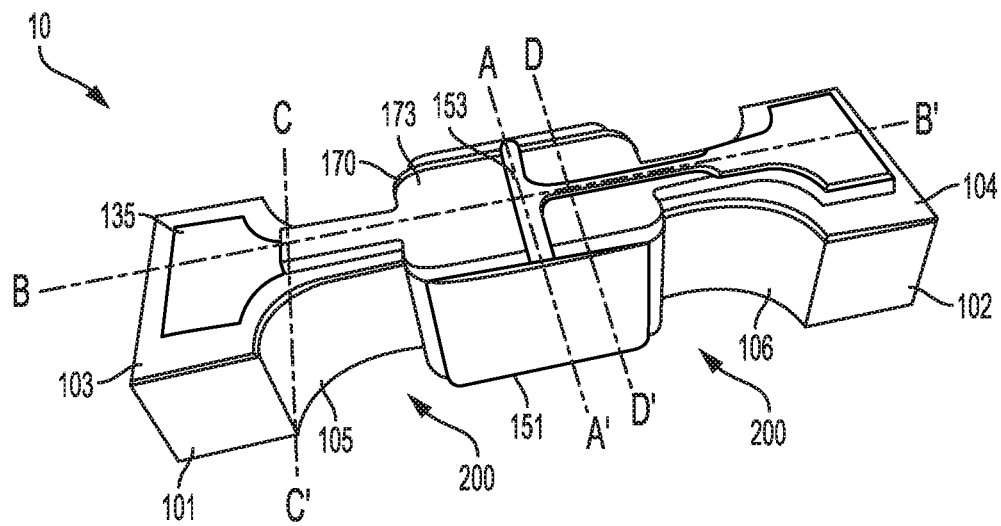
FIG. 1A shows a perspective view of a FinBAR according to an embodiment of the disclosure.

In order to clarify the purpose, technical solution details, and advantages of the embodiments of the present disclosure, the embodiments of the present disclosure are clearly and completely described in the following with reference to the accompanying drawings in the embodiments of the present disclosure. Clearly, the described embodiments are merely exemplary embodiments of the present disclosure, therefore shall not be interpreted as limiting the present disclosure. All other embodiments obtained by those skilled in the art without creative efforts according to the embodiments of the present disclosure are within the scope of the present disclosure.

A greater understanding of the present invention and it many advantages may be had from the following description, accompanied by illustrations. The following descriptions show embodiments and variants of the devices in the present invention, and their applications and fabrication method. They are, of course, not to be considered as limiting the invention. Numerous changes and modifications is made with respect to the invention.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., An existing individually, A and B existing simultaneously, B existing individually. In addition, the character "/" herein generally indicates that the related objects before and after the character form an "or" relationship.

It should be noted that, the expressions such as "upper", "lower", "left", "right" and the like mentioned in embodiments of the present disclosure are described with reference to the placement status in the accompanying drawings, and should not be construed as limiting embodiments of the present disclosure. In addition, it should also be understood that, in the context, while referring to an element being formed "above" or "below" another element, it is possible that the element is directly formed "above" or "below" the other element, it is also possible that the element is formed "above" or "below" the other element via an intermediate element.

The disclosed device is a MEMS acoustic resonator for ultra-high-frequency (UHF: 0.3-3 GHz) and super-high-frequency (SHF: 3-30 GHz) signal processing applications.

Embodiments disclose a FinBAR including a fin formed on a substrate, an inner electrode on the fin, a piezoelectric layer on the inner electrode, and an outer electrode on the piezoelectric layer. The fins having the piezoelectric layer are designed to efficiently trap the elastic energy of bulk acoustic waves and form a FinBAR device which has a high-quality factor and an electromechanical coupling coefficient.

In addition, embodiments also disclose a Fin BAR array integrating a series of the above disclosed Fin BAR devices and capable of continuously filtering in the range of UHF and SHF bands.

Figure 1B:
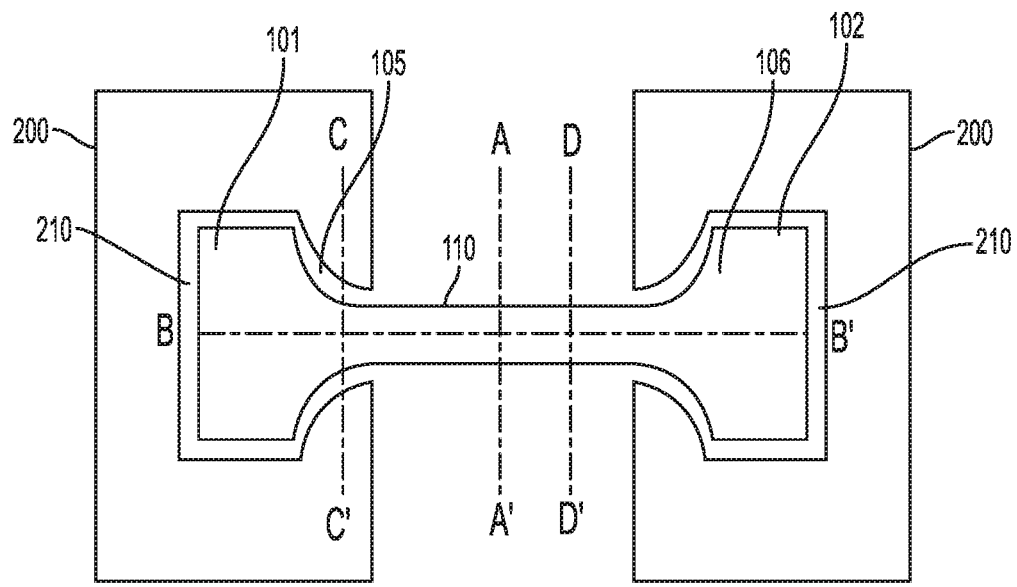
FIG. 1B shows a top view of a FinBAR according to an embodiment of the disclosure.
Figure 2:
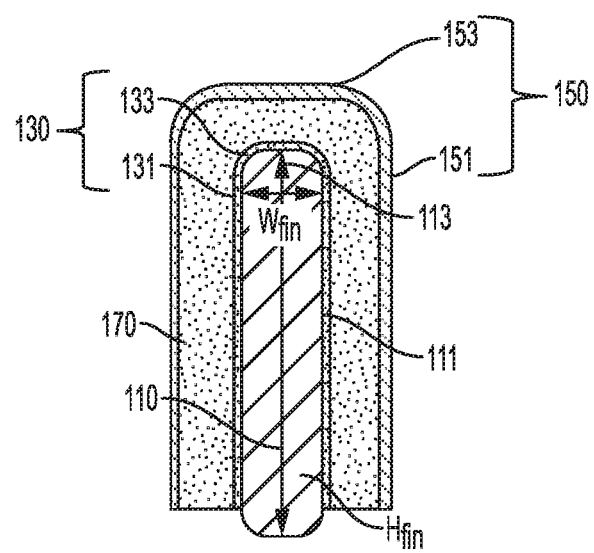
FIG. 2 shows a cross-sectional view taken along line A-A' in FIG. 1A, of a FinBAR according to an embodiment of the disclosure.
Figure 3:
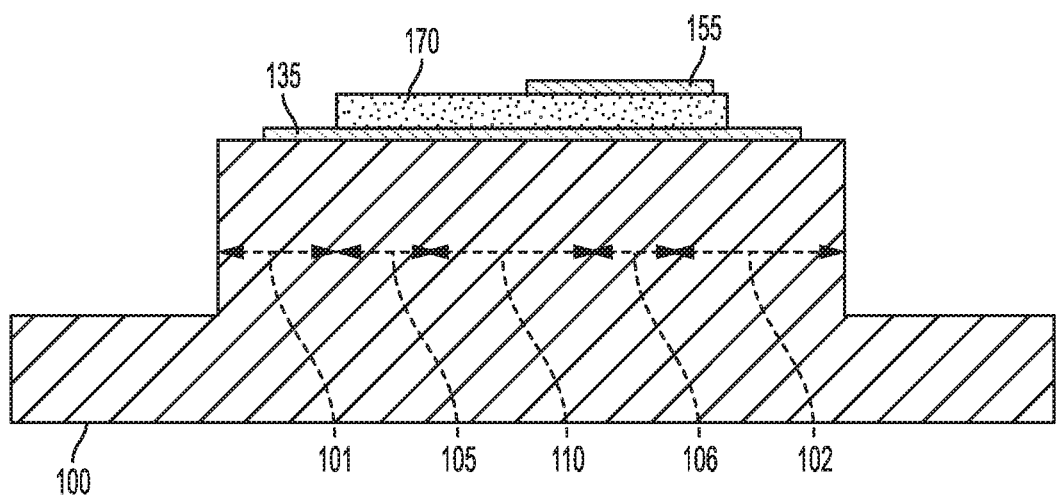
FIG. 3 shows a cross-sectional view taken along line B-B' in FIG. 1A, of a FinBAR according to an embodiment of the disclosure.
Figure 4:
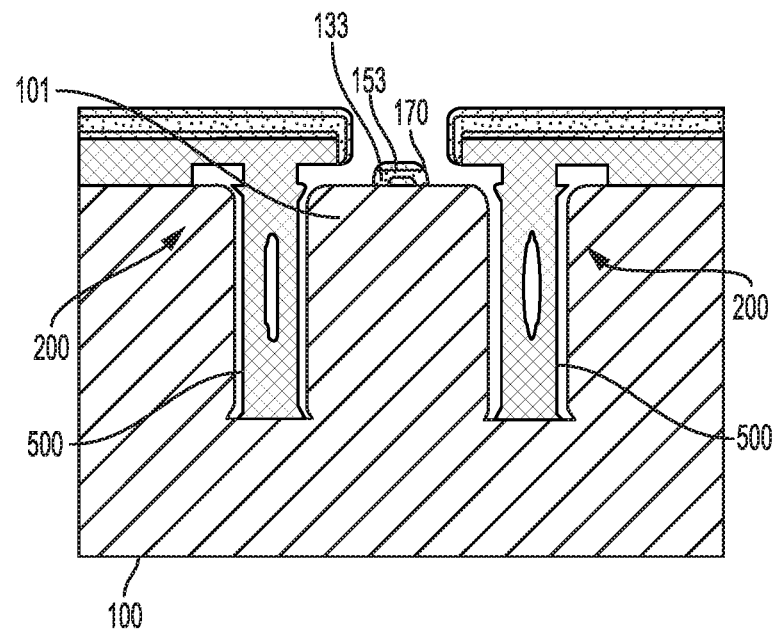
FIG. 4 shows a cross-sectional view taken along line C-C' in FIGS. 1A and 1B, of a FinBAR according to an embodiment of the disclosure.

FIG. 1A shows a perspective view of a FinBAR according to an embodiment of the disclosure. FIG. 1B shows a top view of another FinBAR according to an embodiment of the disclosure. FIGS. 2-4 show cross-sectional views taken along line A-A', line B-B', and line C-C', respectively, of the Fin BAR of FIG. 1A or 1B. Although fin widths are different in FIGS. 1A and 1B, similar parts are named with the same reference numbers for simplicity. Referring to FIGS. 1-4, a FinBAR 10 comprises a substrate 100, a fin 110 formed on the substrate 100, an inner electrode 130 disposed on the fin 110, a piezoelectric layer 170 disposed on the inner electrode 130, and an outer electrode 150 disposed on the piezoelectric layer 170.

The substrate 100 is, for example, a semiconductor, an insulator, a glass, or a fused silica substrate. The fin 110 is formed integrally with the substrate 100 by patterning the substrate 100. The FinBAR 10 further comprises a first portion 101 formed on the substrate 100, a second portion 102 formed on the substrate 100, a first connection portion 105 connecting the first portion 101 to the fin 110, and a second connection portion 106 connecting the second portion 102 to the fin 110. That is, the first portion 101, the first connection portion 105, the fin 110, the second connection portion 106, and the second portion 102 is arranged in a length direction of the fin 110.

Continue referring to FIG. 2-4, the first electrode 135 is disposed on a first top surface 103 of the first portion 101, and a second electrode 155 is disposed on a second top surface 104 of the second portion 102. The first electrode 135 is connected to the inner electrode 130. The first electrode 135 can function as a ground electrode or is connected to another element providing a signal. The second electrode 155 is connected to the outer electrode 150. The second electrode 155 can function as a RF electrode providing a RF signal or is connected to another element.

The inner electrode 130 comprises an inner side metal 131 disposed on at least one fin side surface 111 and an inner top metal 133 disposed on a fin top surface 113. The inner side metal 131 is disposed at both two fin side surfaces 111, such that a left part of the inner side metal 131 faces a right part of the inner side metal 131 and the left part of the inner side metal 131 is connected to the right part of the inner side metal 131 through the inner top metal 133.

The piezoelectric layer 170 is disposed on the inner side metal 131 and the inner top metal 133, such that it surrounds the inner electrode 130.

The outer electrode 150 disposed on the piezoelectric layer 170 comprises an outer side metal 151 and an outer top metal 153. The outer side metal 151 comprises a left part facing the left part of the inner side metal 131 and a right part facing the right part of the inner side metal 131. The outer top metal 153 is disposed on a piezoelectric top surface 173 of the piezoelectric layer 170, while facing the inner top metal 133. The outer top metal 153 connects the left part of the outer side metal 151 and the right part of the outer side metal 151, and is connected to the second electrode 155 while exposing the piezoelectric top surface 173 of the piezoelectric layer 170.

As shown in FIG. 2, the height $H_{fin}$ of the fin 110 is larger than a width $W_{fin}$ of the fin 110, resulting in a larger side metal area than the top metal area. Thus, the characteristic of the FinBAR 110 is mainly controlled by the inner side metal 131 and the outer side metal 151. The width $W_{fin}$ of the fin 110 is in a range of, for example, 0.1 μm to 10 μm.

As the widths of the first connection portion 105, the second connection portion 106, and the fin 110 are usually narrow, a fin flank 200 is built to surround the first portion 101 and the first connection portion 105, the second portion 102, and the second connection portion 106 to protect the device housing. The fin flank 200 is separated from the first portion 101 and the first connection portion 105, the second portion 102, and the second connection portion 106 by the trench 210.

As shown in FIG. 4, a shadow mask 500 is formed in the flank trench 210 and hangs over the trench edges of the fin flank 200, thereby inhibiting the inner electrode 130, the outer electrode 150, and the piezoelectric layer 170 from being formed into the trench 210.

According to the embodiments of the disclosure, fins are formed as a central part of a MEMS structure carved into the substrate, with its lateral dimensions defined by MEMS patterning techniques such as lithography. The parts under the first and second electrodes 135 and 155 may be partially detached from the surrounding flank 200 and the substrate, therefore to have freedom to resonate. However, the fin structures, whether partially released from the substrate or not, is then covered, on the top surface and sidewalls, by a metal-piezoelectric-metal stack forming an acoustic transduction layer. The acoustic transduction layer is deposited through a deposition technique such as sputtering, Metal-Organic Chemical Vapor Deposition (MOCVD), or Molecular Beam Epitaxy (MBE) process. The deposition forms a proper piezoelectric crystalline layer with desired orientation on the sidewall and/or on the top portion of the fin structures. The process of forming the shadow masks includes steps of depositing poly silicon or silicon-nitride as shadow mask layer, patterning the shadow mask layer, before depositing the acoustic transducer stack.

Figure 5:
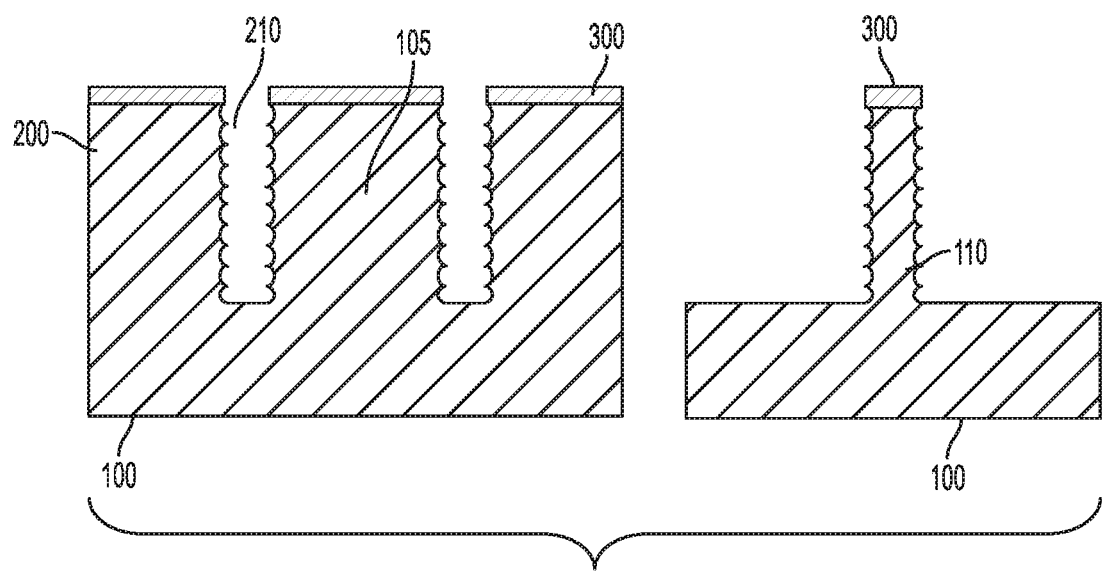
FIG. 5 shows a cross-sectional view taken along line C-C' and line D-D' in FIGS. 1A and 1B, of an etched substrate of a FinBAR according to an embodiment of the disclosure.

FIGS. 5-9 show cross-sectional schematics diagrams taken along line C-C' and line D-D' of FIG. 1B, at each step of the manufacturing process flow of the FinBAR according to an embodiment of the disclosure. FIG. 5 shows a cross-sectional view of an etched substrate of a FinBAR. Initially, a hard mark 300 is disposed on the substrate 100 and then the fin 110 is formed by patterning fins on the substrate 100. In addition, the trench 210 of flanks can also be formed in the substrate 100, thereby defining the fin flank 200 on the substrate 100. The hard mask 300 is made of a material with etch selectivity from the substrate, for example, an oxide, a poly-Si, a poly-Ge, or a hafnium-oxide deposited through Atomic Layer Deposition (ALD). The hard mask 300 is lithographically defined, and the etching process is performed through the hard mask 300. That is, the minimum feature of the fin 110 is defined by the hard mask 300.

Figure 6:
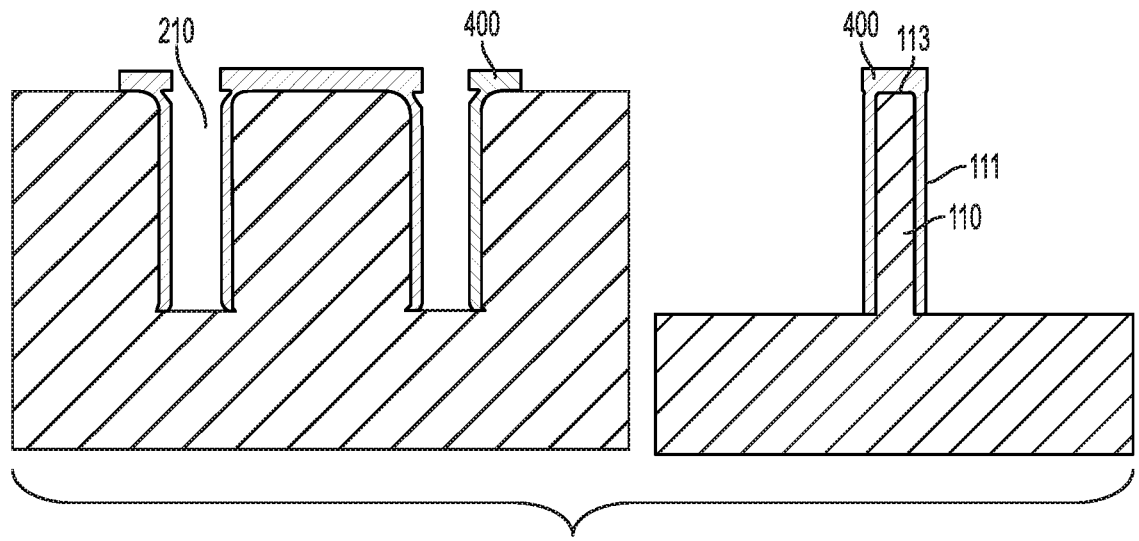
FIG. 6 shows a cross-sectional view taken along line C-C' and line D-D' in FIGS. 1A and 1B, of a sacrificial layer on a substrate of a FinBAR according to an embodiment of the disclosure.

FIG. 6 shows a cross-sectional view of a sacrificial layer on a substrate of a FinBAR. After the etching process in FIG. 5, the hard mask 300 is removed, and the substrate 100 is treated by high temperature annealing for surface smoothening. This annealing process can cure a surface of the fin 110 that would be damaged during the etching process. A sacrificial layer 400 is deposited on the substrate 100 and patterned to cover the top and side walls of fin 110, and also coat the side walls of the trench 210, however the sacrificial layer does not cover the bottom side of the trench 210.

Figure 7:
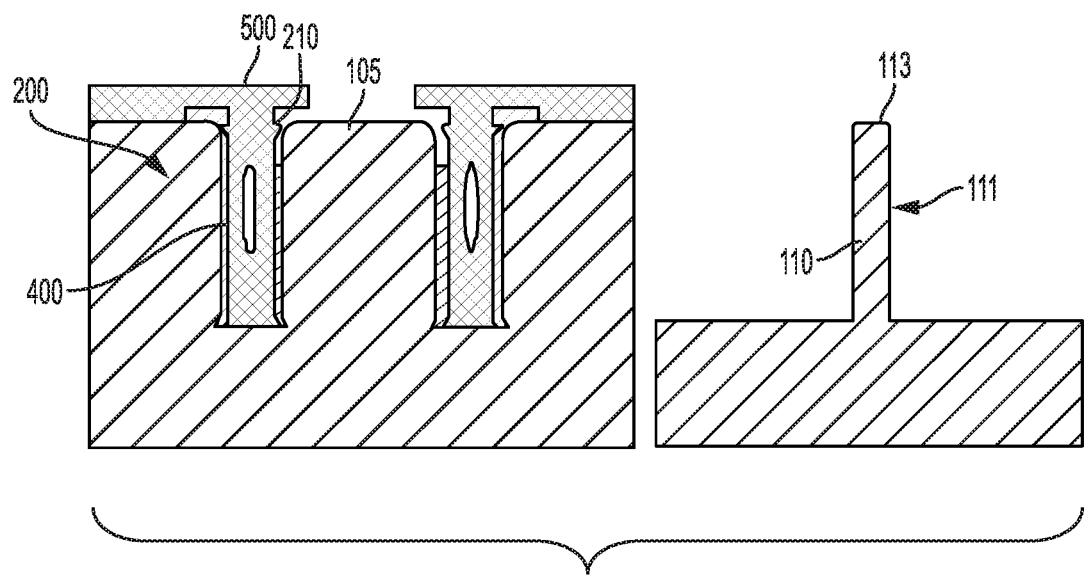
FIG. 7 shows a cross-sectional view taken along line C-C' and line D-D' in FIGS. 1A and 1B, of a shadow mask on a substrate of a FinBAR according to an embodiment of the disclosure.

FIG. 7 shows a cross-sectional view of a shadow mask on a substrate of a FinBAR. Referring to FIG. 7, the shadow mask 500 is deposited on the substrate 100 and then patterned such that the shadow mask 500 is formed on the fin flank 200 and fills the trench 210. By contrast, the fin 110 is exposed outside such that the fin side surface 111 and the fin top surface 113 are not covered by the shadow mask 500. The shadow mask 500 is made of, for example, poly-Si.

Figure 8:
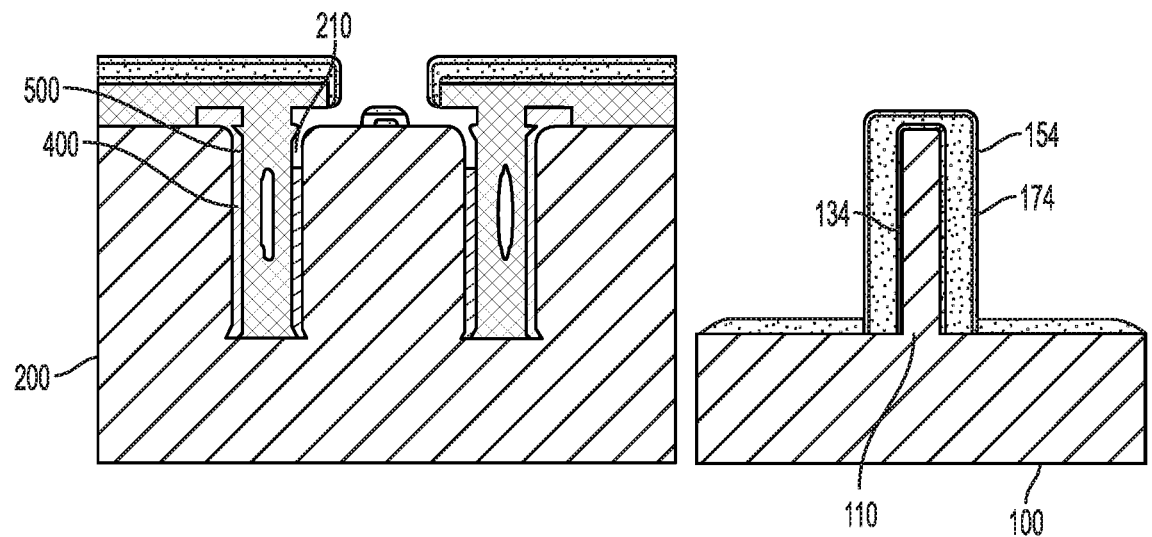
FIG. 8 shows a cross-sectional view taken along line C-C' and line D-D' in FIGS. 1A and 1B, of a piezo-transducer stack of a FinBAR according to an embodiment of the disclosure.

FIG. 8 shows a cross-sectional view of a piezo-transducer stack of a FinBAR taken along line C-C' and line D-D' of FIG. 1B. Referring to FIG. 8, a piezo-transducer structure comprises a metal-piezoelectric-metal stack formed on the fin 110. The piezo-transduction stack comprises an inner metal layer 134, a piezoelectric material layer 174, and an outer metal layer 154. The inner metal layer 134, the piezoelectric material layer 174, and the outer metal layer 154 are sequentially deposited to be stacked on the substrate 100 after the sacrificial layer 400 and the shadow mask 500 have filled the trench 210 as described above. In addition, the inner metal layer 134, the piezoelectric material layer 174, and the outer metal layer 154 are deposited to form a piezoelectric transducer film with C-axis oriented in order to be piezoelectric. C-axis is the axis perpendicular or sufficiently perpendicular to the sidewall surface of the fin 110 and a sufficiently dense texture and thickness uniformity over the entire sidewall. The frequently used synthetic piezoelectric materials are ZnO, PZT, AlN. etc.

Figure 9:
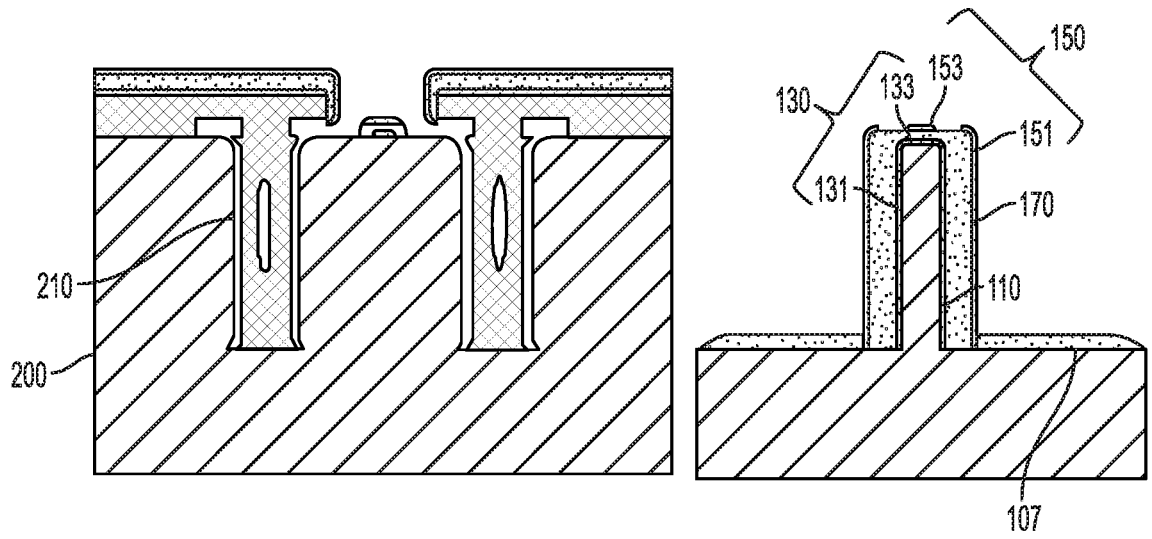
FIG. 9 shows a cross-sectional view taken along line C-C' and line D-D' in FIGS. 1A and 1B, of a patterned piezo-transducer stack of a FinBAR according to an embodiment of the disclosure.

FIG. 9 shows a cross-sectional view of a patterned piezo-transducer stack of a FinBAR. After depositing the inner metal layer 134, the piezoelectric material layer 174, and the outer metal layer 154, the FinBAR is formed by patterning the inner metal layer 134, the piezoelectric material layer 174, and the outer metal layer 154 such that the inner electrode 130 including the inner side metal 131 and the inner top metal 133, the outer electrode 150 including the outer side metal 151 and the outer top metal 153, and the piezoelectric layer 170 are formed. In addition, the inner electrode 130, the piezoelectric layer 170, and the outer electrode 150 is formed on the substrate top surface 107 located adjacent to the fin 110. Meanwhile the sacrificial layer 400 is removed from the trench 210.

Referring to FIGS. 8 and 9, the deposition process for each layer in FIG. 8 and their following patterning process in FIG. 9 is performed alternately. That is, after depositing the inner metal layer 134, the inner electrode 130 is patterned. After patterning the inner electrode 130, the piezoelectric material layer 174 is deposited and then patterned to form the piezoelectric layer 170. The outer metal layer 154 is deposited on the patterned piezoelectric layer 170 and then patterned to form the outer electrode 150.

Figure 10:
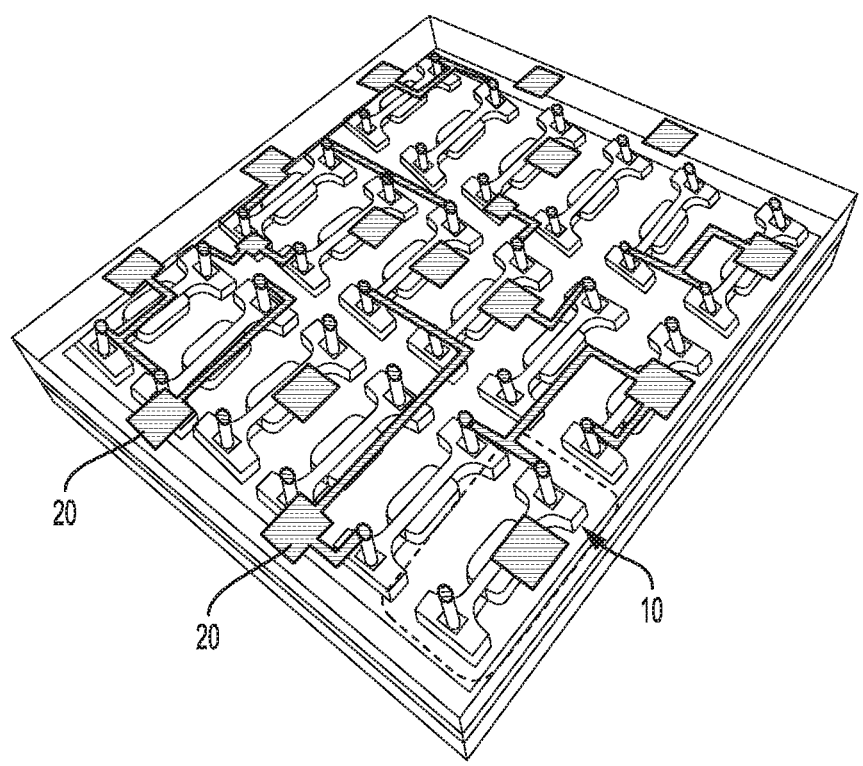
FIG. 10 shows a perspective view of a FinBAR Array according to an embodiment of the disclosure.

FIG. 10 shows a perspective view of a Fin BAR Array according to an embodiment of the disclosure. The FinBAR array comprises a plurality of FinBARs 10 and each FinBAR 10 is coupled with other FinBARs 10 through a metal routing 20. The metal routing 20 provides reconfigurable (static) metallic routing for electrical coupling of the FinBARs 10.

Each FinBAR is characterized with a resonant filtering frequency defined by its lateral fin dimension. Therefore, an array of FinBARs having different lateral fin dimensions provides an integrated acoustic device capable of filtering multiple frequencies simultaneously, according to one embodiment of the disclosure. An array of FinBARs is integrated on a single chip and multiple FinBAR arrays are fabricated on a common substrate like a wafer applying integrated MEMS process, in which lateral sizes of fins are defined by the MEMS patterning techniques. Thus, it only takes a single deposition of piezoelectric material to form various piezoelectric layers in different transduction stacks for all frequencies in the entire UHF and SHF spectra.

The individual FinBARs is electrically connected together, in proper groups and architectures, to form UHF and SHF bandpass filters with reconfigurable frequency, bandwidth, and operation order.

Figure 11:
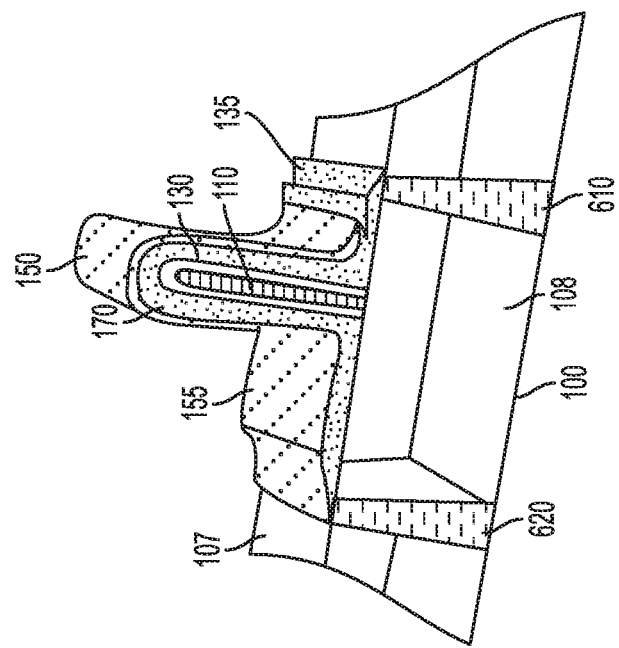
FIG. 11 shows a FinBAR and a FinBAR Array according to an embodiment of the disclosure.
Figure 11:
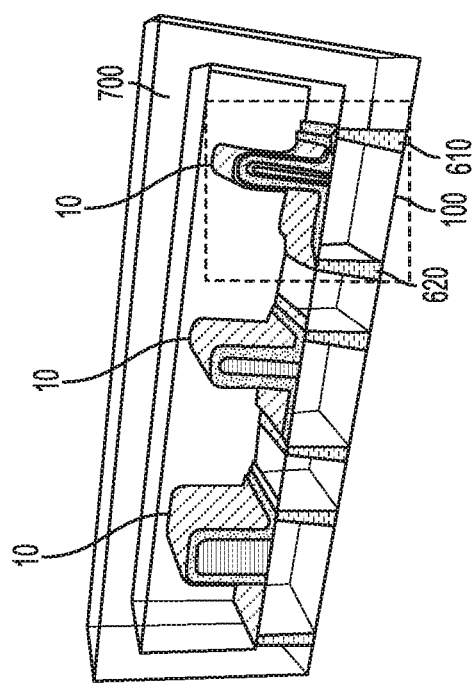

FIG. 11 shows a Fin BAR and a Fin BAR Array according to one embodiment of the disclosure. Referring to FIG. 11, the FinBAR array comprises a plurality of FinBARs 10, wherein each FinBAR 10 has a different width of fin 110. Each FinBAR 10 comprises a first Through Substrate Via (TSV) 610 and a second TSV 620 for connection to another FinBAR or other element of a chip where the array is fabricated on. The first TSV 610 and the second TSV 620 pass through the substrate 100 where the multiple chips are located from the substrate top surface 107 to a substrate bottom surface 108. In addition, the FinBAR array comprises an encapsulation layer 700 housing the substrate 100 and the plurality of FinBARs 10.

The FinBAR array is encapsulated with, for example, a glass/silicon capping/substrate that is threaded with TSVs. The electrical connection between the individual resonators of the encapsulated FinBAR array is realized statically or dynamically through metallization or switching networks that is integrated on top of the encapsulation and connect the resonators through TSVs. The encapsulating housing 700 may provide hermetical seal for the FinBAR arrays if necessary.

Each FinBAR 10 comprises fin 110 on the substrate 100, the inner electrode 130 on the fin 110, the piezoelectric layer 170 on the inner electrode 130, and the outer electrode 150 on the piezoelectric layer 170. Each FinBAR 10 further comprises first electrode 135 formed on the substrate top surface 107 and connected to the inner electrode 130, and the second electrode 155 formed on the substrate top surface 107 and connected to the outer electrode 150. The first electrode 135 is connected to the first TSV 610, and the second electrode 155 is connected to the second TSV 620. The first TSV 610, the first electrode 135, the fin 110, the second electrode 155, and the second TSV 620 are arranged in a width direction of the fin 110.

In an embodiment, the fin structures is engineered by their acoustical dispersion characteristics and designed to efficiently trap a bulk acoustic resonance mode by following the gradual changes in the fin dimensions. The bulk acoustic resonance frequency of a FinBAR is a function of the thickness of the transduction stack and the width of the active transduction region in the fin. Thus, by varying fin width of the FinBARs, a wide range of filtering frequencies, spread over 0.3-30 GHz, is achieved.

The embodiments shown in FIGS. 10 and 11 enable monolithic integration of FinBAR arrays with other electrical and optical components in a hermetically encapsulated architecture. These components can include optical waveguides and switches, or acoustic waveguides, isolators, and circulators, that are integrated on the same substrate of the FinBAR. The monolithically integrated optical and electrical switches enable agile and on-the-fly selection of specific FinBARs to form the desired spectrum analyzers over UHF and SHF bands.

The disclosed FinBARs are superior to the current bulk acoustic wave (BAW) resonators. A BAW resonator cannot provide frequency selectivity as BAW's frequency is only defined by the piezoelectric film thickness, and thickness of the piezoelectric film is put down at once hence is nearly constant over the entire substrate/batch. However the resonating frequency in a FinBAR is selectable from FinBAR's fabricated from the same batch. In addition, a FinBAR array may excite higher order bulk harmonics. Further, FinBARs benefit from the low acoustic dissipation from the fin's crystalline material, so FinBARs have higher quality factors compared to non-crystal piezoelectric materials in BAW resonators. Finally, the FinBAR substrate is thermos-mechanically stable and acoustically dense, which are not characteristics of BAW resonators.

Figure 12:
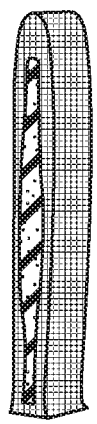
FIG. 12 shows a simulation of a FinBAR model according to an embodiment of the disclosure.

FIG. 12 shows a simulated model of a Fin BAR device according to an embodiment of the disclosure. The FinBAR in the simulation operates on a fused silica substrate in a base vibration mode at 23 GHz in the SHF range.

Figure 13:
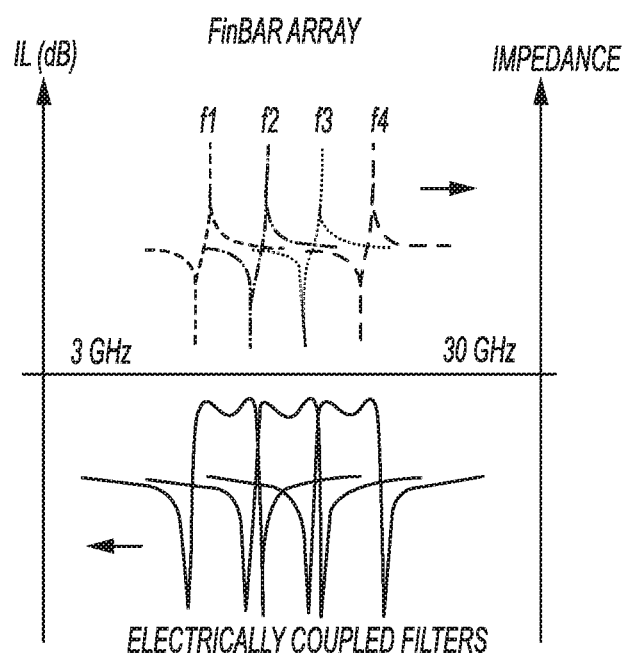
FIG. 13 shows a simulated frequency response of a FinBAR Array and a channel-select filter array over UHF and SHF.

FIG. 13 shows a simulated device IL and Impedance response as a function of SHF frequency of a FinBAR array (upper plot) according to the disclosed embodiments and a channel-select filter array (lower plot). The FinBAR array plot shows resonator characteristics superior to those of the conventional electrically coupled channel-select filter array in the SHF frequency range.

Such broad band acoustic resonator devices are essential to accommodate 5G communication standards for Internet of Things (IoT), where exponential growth of data-rates and number of users call for ultra-efficient and dynamic use of the limited frequency spectrum resources. Besides 5G multiband systems, the UHF and SHF devices enable the first handheld fully-reconfigurable tactical radio with continuous coverage over the wide UHF and SHF spectrum, to benefit from the high-capacity Wideband Global Satellite Communication (WGS SATCOM) network, while providing substantial immunity to jamming.

It should be understood that the examples and embodiments described herein are for illustrative purposes only and that various modifications or changes in light thereof will be suggested to persons skilled in the art and are to be included within the spirit and purview of this application.

What is claimed is:
1. A Fin Bulk Acoustic Resonator (FinBAR), comprising:
   a substrate;
   a fin formed on the substrate;
   an inner electrode disposed on the fin;
   a piezoelectric layer disposed on the inner electrode;
   an outer electrode disposed on the piezoelectric layer;
   a first portion formed on the substrate;
   a second portion formed on the substrate;
   a first connection portion connecting the first portion to the fin; and
   a second connection portion connecting the second portion to the fin,
   wherein the fin is characterized with a width and a height, and wherein the height of the fin is larger than the width of the fin.
2. The Fin BAR according to claim 1, wherein the fin is formed integrally with the substrate.
3. The FinBAR according to claim 1, further comprising a flank portion on the substrate, wherein the flank portion surrounds the fin, the first portion, the first connecting portion, the second portion, and the second connecting portion with a trench.

4. The FinBAR according to claim 3, further comprising a shadow mask disposed on the flank portion and into the trench.

5. The FinBAR according to claim 1, further comprising a first electrode disposed on the first portion and a second electrode disposed on the second portion, wherein the first electrode is connected to the inner electrode and the second electrode is connected to the outer electrode.

6. The FinBAR according to claim 5, wherein the first electrode is a ground electrode and the second electrode is an RF electrode.

7. The FinBAR according to claim 1, wherein the inner electrode comprises an inner side metal disposed on a fin side surface and an inner top metal disposed on a fin top surface.

8. The FinBAR according to claim 7, wherein the outer electrode comprises an outer side metal facing the inner side metal and an outer top metal facing the inner top metal.

9. The FinBAR according to claim 8, wherein the outer top metal is connected to the second electrode, and wherein the outer top metal exposes a top surface of the piezoelectric layer.

10. The FinBAR according to claim 7, wherein the piezoelectric layer has a C-axis perpendicular to the fin side surface with a uniform texture and thickness over the fin side surface.

11. The FinBAR according to claim 1, wherein the width of the fin is in a range of from 0.1 µm to 10 µm.

12. A FinBAR, comprising:
   a substrate;
   a fin formed on a top surface of the substrate, wherein the fin is characterized with a width and a height;
   an inner electrode disposed on the fin;
   a piezoelectric layer disposed on the inner electrode;
   an outer electrode disposed on the piezoelectric layer;
   a first portion formed on the substrate;
   a second portion formed on the substrate;
   a first connection portion connecting the first portion to the fin;
   a second connection portion connecting the second portion to the fin;
   a first electrode formed on the top surface of the first portion and connected to the inner electrode;
   a second electrode formed on the top surface of the second portion and connected to the outer electrode;
   a first through-substrate-via passing through the substrate and connecting to the first electrode; and
   a second through-substrate-via passing through the substrate and connecting to the second electrode.

13. The FinBAR according to claim 12, further comprising an encapsulation layer disposed over the top surface of the substrate, the fin, the inner electrode, the piezoelectric layer, the outer electrode, the first portion, the second portion, the first connection portion, the second connection portion, the first electrode, and the second electrode.

14. The FinBAR according to claim 12, wherein the first electrode and the second electrode are positioned in a width direction of the fin.

15. The FinBAR according to claim 12, wherein the substrate is a semiconductor, an insulator, or a fused silica substrate.

16. A FinBAR array, comprising:
   a plurality of FinBARs, each being a FinBAR according to claim 13, wherein at least two of the FinBARs have a different fin width from each other.

17. A method for manufacturing a FinBAR, the method comprising:
   providing a substrate;
   depositing a hard mask on the substrate;
   patterning the hard mask to form a fin, a first portion and a second portion both connecting to the fin, and a trench surrounding the fin, the first portion, and the second portion;
   removing the hard mask;
   forming a shadow mask around the fin and into the trench such that the fin is exposed through the shadow mask;
   forming an inner electrode on the fin;
   forming a piezoelectric layer on the inner electrode; and
   forming an outer electrode on the piezoelectric layer, wherein a height of the fin is larger than a width of the fin.

18. The method according to claim 17, further comprising: forming a sacrificial layer on a side surface of the trench and on the fin before forming the shadow mask, wherein the shadow mask is in contact with the sacrificial layer; and removing the sacrificial layer from the side surface of the trench to at least partially free the first and second portions from the substrate.

19. The method according to claim 17, wherein forming the piezoelectric layer comprises a sputtering process such that the piezoelectric layer has a C-axis perpendicular to a fin side surface, a uniform texture and a uniform thickness over the fin side surface.

* * * * *